United States Patent
Hazeghi et al.

(10) Patent No.: US 9,930,317 B2
(45) Date of Patent: Mar. 27, 2018

(54) SYSTEM AND METHOD FOR SPECKLE REDUCTION IN LASER PROJECTORS

(71) Applicant: Aquifi, Inc., Palo Alto, CA (US)

(72) Inventors: Aryan Hazeghi, Palo Alto, CA (US); Abbas Rafii, Palo Alto, CA (US)

(73) Assignee: Aquifi, Inc., Palo Alto, CA (US)

( * ) Notice: Subject to any disclaimer, the term of this patent is extended or adjusted under 35 U.S.C. 154(b) by 0 days.

(21) Appl. No.: 15/381,938

(22) Filed: Dec. 16, 2016

(65) Prior Publication Data
US 2017/0180708 A1    Jun. 22, 2017

Related U.S. Application Data

(60) Provisional application No. 62/269,903, filed on Dec. 18, 2015.

(51) Int. Cl.
| | | |
|---|---|---|
| H04N 13/00 | (2006.01) | |
| H04N 13/02 | (2006.01) | |
| H01S 5/065 | (2006.01) | |

(52) U.S. Cl.
CPC ....... H04N 13/0253 (2013.01); H01S 5/0654 (2013.01); H04N 13/0239 (2013.01); H04N 13/0296 (2013.01)

(58) Field of Classification Search
CPC ........ G02B 27/48; G02B 27/10; G02B 26/10; G02B 26/08; H04N 13/02
USPC .................................................... 348/36–61
See application file for complete search history.

(56) References Cited

U.S. PATENT DOCUMENTS

| | | | |
|---|---|---|---|
| 8,072,488 B2 * | 12/2011 | Cable ................... | G03H 1/2294 348/51 |
| 2006/0209913 A1 | 9/2006 | Yokoyama et al. | |
| 2010/0026868 A1 | 2/2010 | Pertsel et al. | |
| 2011/0075055 A1 | 3/2011 | Bilbrey | |
| 2011/0298896 A1 * | 12/2011 | Dillon .................... | G02B 27/48 348/46 |
| 2015/0145955 A1 | 5/2015 | Russell | |

FOREIGN PATENT DOCUMENTS

JP    2004-144794 A    5/2004

OTHER PUBLICATIONS

English Translation of JP 2004-144794 A (7 pages).
International Search Report and Written Opinion for Application No. PCT/US16/67306, dated Mar. 3, 2017 (15 pages).

* cited by examiner

*Primary Examiner* — Andy Rao
(74) *Attorney, Agent, or Firm* — Lewis Roca Rothgerber Christie LLP

(57) ABSTRACT

A method for applying power in a plurality of pulses to the projection source to control the projection source to emit coherent light during an exposure interval comprising at least two sub-intervals, the applied power causing the projection source to have different temperatures during first and second sub-intervals of the at least two sub-intervals; and emitting light from the projection source, wherein the projection source emits light having different wavelengths during the first and second sub-intervals in accordance with the different temperatures of the projection source.

27 Claims, 10 Drawing Sheets
(6 of 10 Drawing Sheet(s) Filed in Color)

SYSTEM AND METHOD FOR SPECKLE REDUCTION IN LASER PROJECTORS

CROSS-REFERENCE TO RELATED APPLICATION(S)

This application claims the benefit of U.S. Provisional Patent Application Ser. No. 62/269,903, filed in the United States Patent and Trademark Office on Dec. 18, 2015, the entire disclosure of which is herein incorporated by reference.

FIELD

Aspects of embodiments of the present invention relate to laser projectors, in particular, reducing the appearance of speckle noise in laser projectors. Aspects of embodiments of the present invention also relate to active depth camera systems using laser projectors.

BACKGROUND

A depth camera system or a range camera can be used to capture depth information about a scene. In particular, a depth camera system can generate a two-dimensional image or "depth map" where each value in the image corresponds to the distance between the depth camera and a portion of the scene that is in the field of view of the camera. The depth information may also be referred to as three-dimensional information, and the resulting depth map may be referred to as a three-dimensional reconstruction of the scene. This can be contrasted with a traditional camera, which captures the amount of light received from portions of the scene in the field of view of the camera, but not the distances of the objects and other features of the scene.

One class of depth camera systems uses a projection system or projection source to assist in the reconstruction of the depth information by projecting light onto a scene. Such systems may be referred to herein as being "active," as contrasted with "passive" depth camera systems that do not include a projection system. These include: projecting an encoded pattern, such as those commonly used in structured-light methods; projecting a pattern to create a texture on the scene; and projecting a pattern that is designed or optimized for three-dimensional reconstruction. Projecting a texture or a pattern designed for three-dimensional reconstruction is typically used with systems that include two or more cameras.

The aforementioned methods therefore rely on projection system to project a pattern in the visible or invisible portion of the optical spectrum. In many such cases, the light source used for the projection is a coherent laser light source. The advantages of using such a light source include energy efficiency, compact physical size, reliability, and ease of system integration to name a few. Furthermore, this coherent light source can be used in conjunction with diffractive optics to produce a pattern of collimated spots, collimated lines, or an uncollimated diffuse pattern.

The projection pattern is then imaged by an appropriate imaging sensor, such as a complementary metal oxide semiconductor (CMOS) image sensor or a charge coupled device (CCD) image sensor. In most applications, these imaging sensors are sensitive to the intensity of light and not the phase of light, and have a finite detection aperture.

When such an imaging sensor is used to image a projection pattern produced by coherent light, such as coherent laser light, the image will generally include speckle noise. (See, e.g., Dainty, J. Christopher. "Laser speckle and related phenomena." *Berlin and New York, Springer-Verlag (Topics in Applied Physics. Volume* 9), 1975. 298 p. Vol. 9. 1975; J. W. Goodman, "Some Fundamental Properties of Speckle," J. Opt. Soc. Am. 66, pp. 1145-1149, 1976; and Wang, Lingli, et al. "Speckle reduction in laser projection systems by diffractive optical elements." *Applied optics* 37.10 (1998): 1770-1775.) The speckling becomes especially evident when the laser projection is imaged using compact camera systems that have a small collection aperture. Furthermore, the speckle noise is angle dependent in that two different image sensors viewing the same coherent pattern from two angles will observe different speckle noise.

SUMMARY

Aspects of embodiments of the present invention relate to a system and method for reducing speckle noise associated with a coherent projection source, which can improve the performance of an active depth camera system using multiple cameras. Aspects of embodiments of the present invention may also be applicable to reducing speckle noises in other circumstances involving the use of a coherent projection source.

According to one embodiment of the present invention, a stereo camera system includes: a processor; a plurality of cameras coupled to the processor and configured to have overlapping fields of view, the cameras including a first camera and a second camera; a coherent light projection source coupled to the processor and configured to emit light toward the fields of view of the cameras; and memory coupled to the processor, the memory storing instructions that, when executed by the processor, cause the processor to: apply power in a plurality of pulses to the projection source to control the projection source to emit coherent light during an exposure interval including at least two sub-intervals, the applied power causing the projection source to have different temperatures during first and second sub-intervals of the at least two sub-intervals, wherein the projection source emits light having different wavelengths during the first and second sub-intervals in accordance with the different temperatures of the projection source; and control the first camera and the second camera to concurrently capture, respectively, a first image and a second image over the same exposure interval. In embodiments of the present invention, the projection source has a different temperature during the second sub-interval than during the first sub-interval, which causes the projection source to emit light having different wavelengths in the first and second sub-intervals, thereby reducing the appearance of speckle noise.

The at least two sub-intervals may include at least ten sub-intervals. The at least two sub-intervals may include at least fifty sub-intervals.

The coherent light projection source may be a single mode laser diode.

The stereo camera system may further include a diffractive optics system, wherein the coherent light projection source is configured to emit light through the diffractive optics system.

The memory may further store instructions that, when executed by the processor, cause the processor to control the projection source using a pulse width modulated signal, wherein the power applied during the first sub-interval corresponds to a first pulse of the pulse width modulated signal, and wherein the power applied during the second sub-interval corresponds to a second pulse of the pulse width modulated signal.

The different wavelengths may include first and second wavelengths respectively controlled in accordance with the energy of the first and second pulses.

The pulse width modulated signal may be generated pseudo-randomly.

The pulse width modulated signal may have a pattern during the exposure interval.

A duty ratio of the pulse width modulated signal may be controlled in accordance with a target projection power of the projection source.

The different wavelengths may include first and second wavelengths, wherein the difference in wavelength between the first wavelength and the second wavelength may be greater than 1.5 nm.

The projection source may contain no moving parts.

The images captured by the cameras may be provided to a depth sensing application.

According to one embodiment of the present invention, a method for capturing images includes: applying power in a plurality of pulses to the projection source to control the projection source to emit coherent light during an exposure interval including at least two sub-intervals, the applied power causing the projection source to have different temperatures during first and second sub-intervals of the at least two sub-intervals, wherein the projection source emits light having different wavelengths during the first and second sub-intervals in accordance with the different temperatures of the projection source; and controlling a first camera and a second camera to concurrently capture, respectively, a first image and a second image over the exposure interval, the first camera and second camera having overlapping fields of view, the projection source being configured to emit light toward the fields of view of the cameras.

The at least two sub-intervals may include at least ten sub-intervals. The at least two sub-intervals may include at least fifty sub-intervals.

The power applied during the first sub-interval may correspond to a first pulse of a pulse width modulated signal, and the power applied during the second sub-interval may correspond to a second pulse of the pulse width modulated signal.

The different wavelengths may include first and second wavelengths respectively controlled in accordance with the energy of the first and second pulses.

The pulse width modulated signal may be generated pseudo-randomly.

The different wavelengths may include first and second wavelengths and the difference in wavelength between the first wavelength and the second wavelength may be greater than 1.5 nm.

According to one embodiment of the present invention, a method for operating a coherent light projection source includes: applying power in a plurality of pulses to the projection source to control the projection source to emit coherent light during an exposure interval comprising at least two sub-intervals, the applied power causing the projection source to have different temperatures during first and second sub-intervals of the at least two sub-intervals; and emitting light from the projection source, wherein the projection source emits light having different wavelengths during the first and second sub-intervals in accordance with the different temperatures of the projection source, wherein, the first sub-interval is less than 1/10th the length of the exposure interval.

The at least two sub-intervals may include at least ten sub-intervals. The at least two sub-intervals may include at least fifty sub-intervals.

The power applied during the first sub-interval may correspond to a first pulse of a pulse width modulated signal, and the power applied during the second sub-interval may correspond to a second pulse of the pulse width modulated signal.

The different wavelengths may include first and second wavelengths respectively controlled in accordance with the energy of the first and second pulses.

The pulse width modulated signal may be generated pseudo-randomly.

The first sub-interval may be less than 7 milliseconds, and the second sub-interval may be less than 7 milliseconds.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, together with the specification, illustrate exemplary embodiments of the present invention, and, together with the description, serve to explain the principles of the present invention.

DETAILED DESCRIPTION

Figure 1:
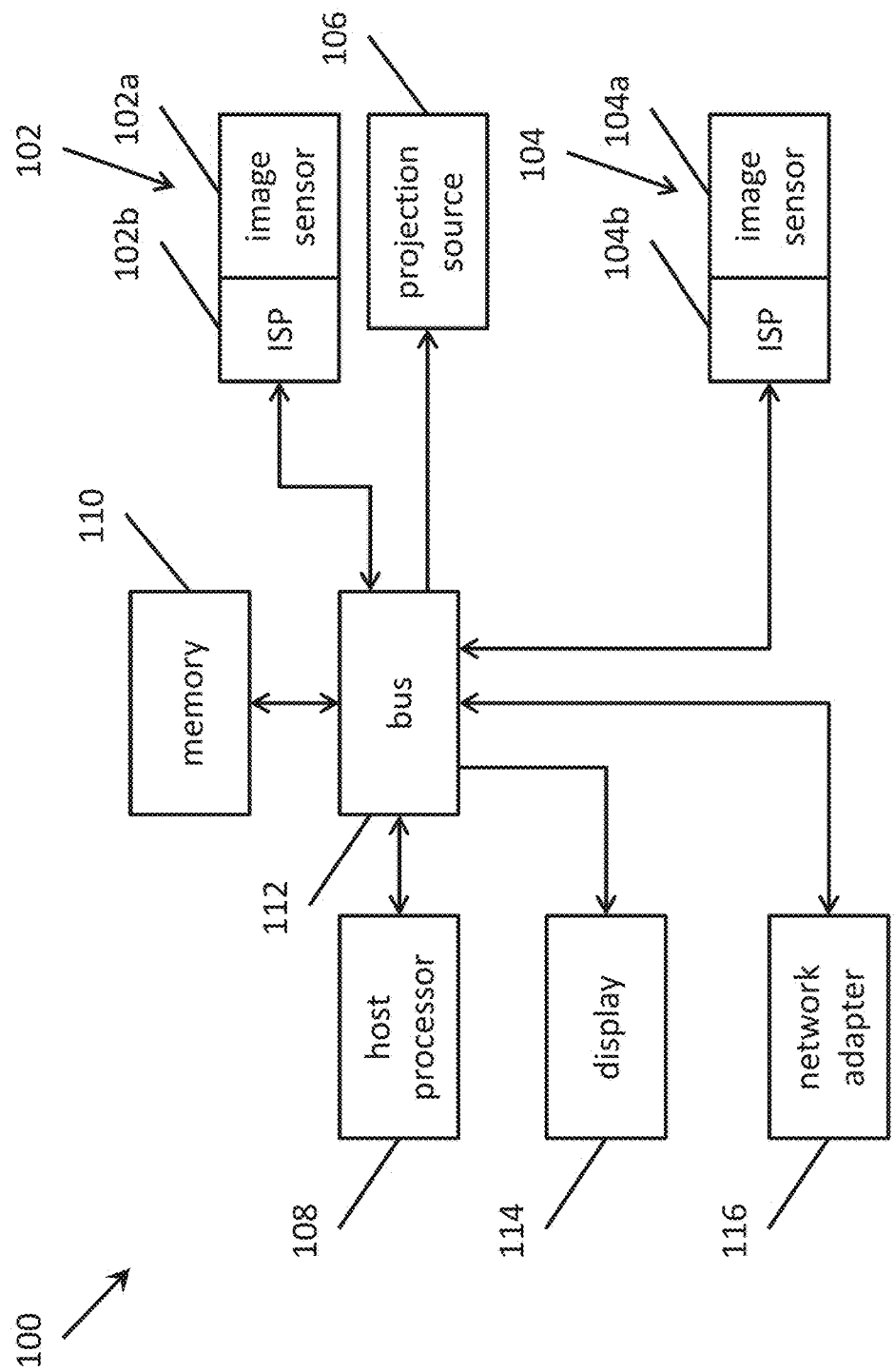
FIG. 1 is a block diagram illustrating an image capture system according to one embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

A depth camera system may use a projection source to provide supplemental illumination to allow the capture of information about the features of a scene even when the scene is too dark to detect any features. Such depth camera systems that include a projection source for supplemental illumination will be referred to herein as active depth camera systems. Furthermore, the projection source can also project a pattern even when a scene is generally well-lit, in order to provide texture to surfaces in the scene that may otherwise be featureless, thereby allowing detection of the shapes of those relatively featureless surfaces. In some embodiments, the projection source emits structured light, such as a pattern of grids or horizontal bars. In some embodiments, the pattern is a dot pattern that is designed such that every local patch of the pattern is unique across the entire emitted pattern. The projection system may emit visible light (e.g., light within the human visible spectrum) or may emit invisible light (e.g., light outside of the human visible spectrum, such as infrared light).

As discussed above, in many such cases, the light source used for the projection is a coherent laser light source. Advantages of using such a light source include energy efficiency, compact physical size, reliability, and ease of system integration. Furthermore, a coherent light source can be used with diffractive optics to produce a pattern of collimated spots, collimated lines, or an uncollimated diffuse pattern, which may be significantly more compact and/or energy efficient than other techniques for generating a dot pattern, while an incoherent light source generally would not be usable with diffractive optics to achieve such a result.

When an imaging sensor is used to image a projection pattern produced by coherent light (such as coherent laser light), the image will generally include speckle noise, where the speckle noise causes the pattern to appear different when viewed from different angles (e.g., different portions of the pattern will be brighter or darker). The speckling becomes especially evident when the laser projection is imaged using compact camera systems that have a small collection aperture. Speckle may also be referred to as, or appear as, flickering or fluttering, such as when dealing with visible light projections.

Some active stereo depth camera system systems project light onto the surfaces of the scene, capture the scene from multiple angles using multiple cameras, identify corresponding portions of the scene by matching features found in the multiple cameras, and compute the depths of surfaces in the scene based on the disparity (differences in location) of the matched features captured by the cameras.

However, the angle dependence of the speckle noise may cause the projected pattern to appear differently when received at different image sensors, thereby frustrating the feature matching process, and thereby making speckle noise especially problematic for active stereo depth camera systems.

As such, aspects of embodiments of the present invention are directed to systems and methods for reducing speckle noise from coherent light sources such as diode lasers, and systems and methods for improving the performance of active stereo depth cameras systems by controlling the coherent light sources to reduce speckle noise.

Depth Camera Systems

FIG. 1 is a block diagram illustrating an image capture system 100 according to one embodiment of the present invention. The image capture system 100 shown in FIG. 1 includes a first camera 102, a second camera 104, a projection source 106 (or illumination source or active projection system), and a host processor 108 and memory 110, wherein the host processor may be, for example, a graphics processing unit (GPU), a more general purpose processor (CPU), an appropriately configured field programmable gate array (FPGA), or an application specific integrated circuit (ASIC). The first camera 102 and the second camera 104 include corresponding image sensors 102a and 104a, and may also include corresponding image signal processors (ISP) 102b and 104b. The various components may communicate with one another over a system bus 112. The image capture system 100 may include additional components such as a display 114 to allow the device to display images, and a network adapter 116 to communicate with other devices. The image capture system may also include other communication components, such as a universal serial bus (USB) interface controller.

In some embodiments, the image sensors 102a and 104a of the cameras 102 and 104 are RGB-IR image sensors, as shown in FIG. 2A. Image sensors that are capable of detecting visible light (e.g., red-green-blue, or RGB) and invisible light (e.g., infrared or IR) information may be, for example, charged coupled device (CCD) or complementary metal oxide semiconductor (CMOS) sensors. FIGS. 2A and 2B compare the architecture of an RGB-IR image sensor with that of a conventional RGB image sensor. Generally, as shown in FIG. 2B, a conventional RGB camera sensor includes pixels arranged in a "Bayer layout" or "RGBG layout," which is 50% green, 25% red, and 25% blue. Band pass filters (or "micro filters") are placed in front of individual photodiodes (e.g., between the photodiode and the optics associated with the camera) for each of the green, red, and blue wavelengths in accordance with the Bayer layout. Generally, a conventional RGB camera sensor also includes an infrared (IR) filter or IR cut-off filter (formed, e.g., as part of the lens or as a coating on the entire image sensor chip) which further blocks signals in an IR portion of electromagnetic spectrum, as illustrated by the dashed line in FIG. 2B.

An RGB-IR sensor as illustrated in FIG. 2A is substantially similar to a conventional RGB sensor, but may include different color filters. For example, as shown in FIG. 2A, in an RGB-IR sensor, one of the green filters in every group of four photodiodes is replaced with an IR band-pass filter (or micro filter) to create a layout that is 25% green, 25% red, 25% blue, and 25% infrared, where the infrared pixels are intermingled among the visible light pixels. In addition, the IR cut-off filter may be omitted from the RGB-IR sensor, the IR cut-off filter may be located only over the pixels that detect red, green, and blue light, or the IR filter can be designed to pass visible light as well as light in a particular wavelength interval (e.g., 840-860 nm). An image sensor capable of capturing light in multiple portions or bands or spectral bands of the electromagnetic spectrum (e.g., red, blue, green, and infrared light) will be referred to herein as a "multi-channel" image sensor.

In some embodiments of the present invention, the image sensors 102a and 104a are conventional visible light sensors. In some embodiments of the present invention, the system includes one or more visible light cameras (e.g., RGB cameras) and, separately, one or more invisible light cameras (e.g., infrared cameras, where an IR band-pass filter is located across all over the pixels).

Generally speaking, a stereoscopic depth camera system includes at least two cameras that are spaced apart from each other and rigidly mounted to a shared structure such as a rigid frame. The cameras are oriented in substantially the same direction (e.g., the optical axes of the cameras may be substantially parallel) and have overlapping fields of view. These individual cameras can be implemented using, for example, a complementary metal oxide semiconductor (CMOS) or a charge coupled device (CCD) image sensor with an optical system (e.g., including one or more lenses) configured to direct or focus light onto the image sensor. The optical system can determine the field of view of the camera, e.g., based on whether the optical system is implements a "wide angle" lens, a "telephoto" lens, or something in between.

In the following discussion, the image acquisition system of the depth camera system may be referred to as having at least two cameras, which may be referred to as a "master" camera and one or more "slave" cameras. Generally speaking, the estimated depth or disparity maps computed from the point of view of the master camera, but any of the cameras may be used as the master camera. As used herein, terms such as master/slave, left/right, above/below, first/second, and CAM1/CAM2 are used interchangeably unless noted. In other words, any one of the cameras may be master or a slave camera, and considerations for a camera on a left side with respect to a camera on its right may also apply, by symmetry, in the other direction. In addition, while the considerations presented below may be valid for various numbers of cameras, for the sake of convenience, they will generally be described in the context of a system that includes two cameras. For example, a depth camera system may include three cameras. In such systems, two of the cameras may be invisible light (infrared) cameras and the third camera may be a visible light (e.g., a red/blue/green color camera) camera.

To detect the depth of a feature in a scene imaged by the cameras, the depth camera system determines the pixel location of the feature in each of the images captured by the cameras. The distance between the features in the two images is referred to as the disparity, which is inversely related to the distance or depth of the object. (This is the effect when comparing how much an object "shifts" when viewing the object with one eye at a time—the size of the shift depends on how far the object is from the viewer's eyes, where closer objects make a larger shift and farther objects make a smaller shift and objects in the distance may have little to no detectable shift.) Techniques for computing depth using disparity are described, for example, in R. Szeliski. "Computer Vision: Algorithms and Applications", Springer, 2010 pp. 467 et seq.

The magnitude of the disparity between the master and slave cameras depends on physical characteristics of the depth camera system, such as the pixel resolution of cameras, distance between the cameras and the fields of view of the cameras. Therefore, to generate accurate depth measurements, the depth camera system (or depth perceptive depth camera system) is calibrated based on these physical characteristics.

In some depth camera systems, the cameras may be arranged such that horizontal rows of the pixels of the image sensors of the cameras are substantially parallel. Image rectification techniques can be used to accommodate distortions to the images due to the shapes of the lenses of the cameras and variations of the orientations of the cameras.

In more detail, camera calibration information can provide information to rectify input images so that epipolar lines of the equivalent camera system are aligned with the scanlines of the rectified image. In such a case, a 3D point in the scene projects onto the same scanline index in the master and in the slave image. Let $u_m$ and $u_s$ be the coordinates on the scanline of the image of the same 3D point p in the master and slave equivalent cameras, respectively, where in each camera these coordinates refer to an axis system centered at the principal point (the intersection of the optical axis with the focal plane) and with horizontal axis parallel to the scanlines of the rectified image. The difference $u_s-u_m$ is called disparity and denoted by d; it is inversely proportional to the orthogonal distance of the 3D point with respect to the rectified cameras (that is, the length of the orthogonal projection of the point onto the optical axis of either camera).

Stereoscopic algorithms exploit this property of the disparity. These algorithms achieve 3D reconstruction by matching points (or features) detected in the left and right views, which is equivalent to estimating disparities. Block matching (BM) is a commonly used stereoscopic algorithm. Given a pixel in the master camera image, the algorithm computes the costs to match this pixel to any other pixel in the slave camera image. This cost function is defined as the dissimilarity between the image content within a small window surrounding the pixel in the master image and the pixel in the slave image. The optimal disparity at point is finally estimated as the argument of the minimum matching cost. This procedure is commonly addressed as Winner-Takes-All (WTA). These techniques are described in more detail, for example, in R. Szeliski. "Computer Vision: Algorithms and Applications", Springer, 2010. Since stereo algorithms like BM rely on appearance similarity, disparity computation becomes challenging if more than one pixel in the slave image have the same local appearance, as all of these pixels may be similar to the same pixel in the master image, resulting in ambiguous disparity estimation. A typical situation in which this may occur is when visualizing a scene with constant brightness, such as a flat wall.

Methods exist that provide additional illumination by projecting a pattern that is designed to improve the performance of block matching algorithm that can capture small 3D details such as the one described in U.S. Pat. No. 9,392,262 "System and Method for 3D Reconstruction Using Multiple Multi-Channel Cameras," issued on Jul. 12, 2016, the entire disclosure of which is incorporated herein by reference. Another approach projects a pattern that is purely used to provide a texture to the scene and particularly improve the depth estimation of texture-less regions by disambiguating portions of the scene that would otherwise appear the same.

The projection source 106 according to embodiments of the present invention may be configured to emit visible light (e.g., light within the spectrum visible to humans and/or other animals) or invisible light (e.g., infrared light) toward the scene imaged by the cameras 102 and 104. In other words, the projection source may have an optical axis substantially parallel to the optical axes of the cameras 102 and 104 and may be configured to emit light in the direction of the fields of view of the cameras 102 and 104. An invisible light projection source may be better suited to for situations where the subjects are people (such as in a videoconferencing system) because invisible light would not interfere with the subject's ability to see, whereas a visible light projection source may shine uncomfortably into the subject's eyes or may undesirably affect the experience by adding patterns to the scene. Examples of systems that include invisible light projection sources are described, for example, in U.S. patent application Ser. No. 14/788,078 "Systems and Methods for Multi-Channel Imaging Based on Multiple Exposure Settings," filed in the United States Patent and Trademark Office on Jun. 30, 2015, the entire disclosure of which is herein incorporated by reference.

Active projection sources can also be classified as projecting static patterns, e.g., patterns that do not change over time, and dynamic patterns, e.g., patterns that do change over time. In both cases, one aspect of the pattern is the illumination level of the projected pattern. This may be relevant because it can influence the depth dynamic range of the depth camera system. For example, if the optical illumination is at a high level, then depth measurements can be made of distant objects (e.g., to overcome the diminishing of the optical illumination over the distance to the object, by a factor proportional to the inverse square of the distance) and under bright ambient light conditions. However, a high optical illumination level may cause saturation of parts of the scene that are close-up. On the other hand, a low optical illumination level can allow the measurement of close objects, but not distant objects.

Speckle Noise and Active Depth Projection Systems

Figure 2:
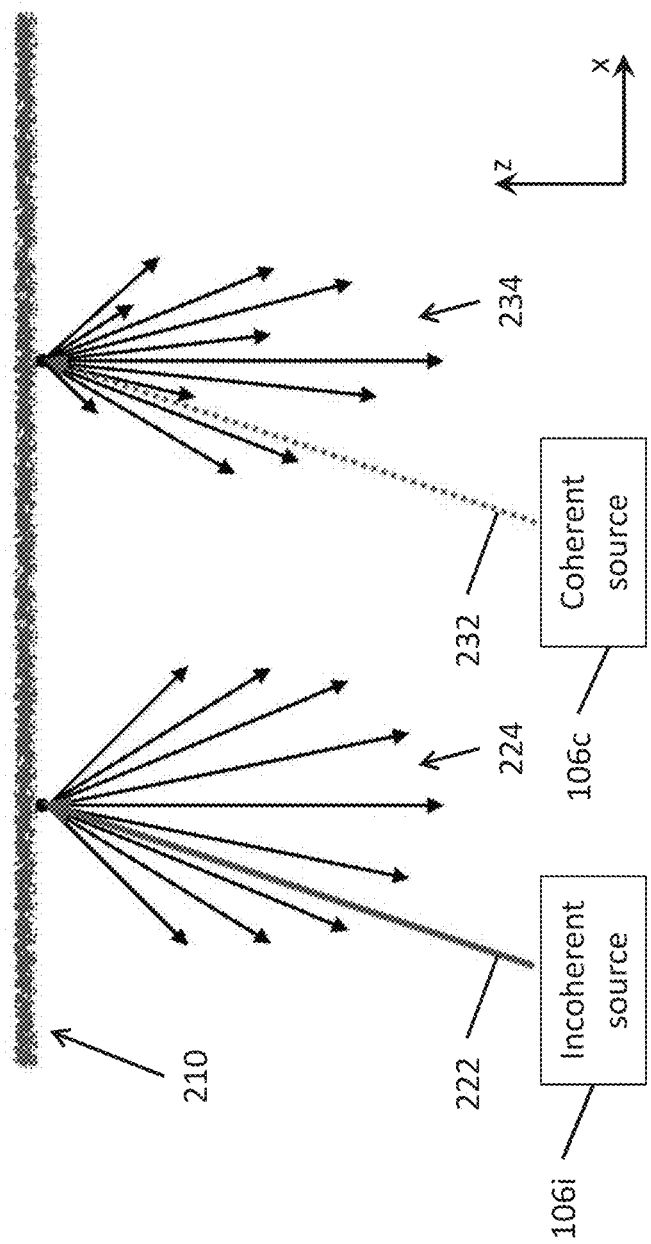
FIG. 2 is a schematic illustration of the intensity of light reflected by a rough surface when the light source is incoherent and when the light source is coherent.

Generally speaking, laser speckling arises from strong interference of the laser light wave-front upon reflection from a surface that is rough. This effect is particularly noticeable when collected by a detector having a finite or small aperture. FIG. 2 is a schematic illustration of the intensity of light reflected by a rough surface when the light source is incoherent and when the light source is coherent, where the intensity of the reflected light is depicted by the length of the arrows. In this context, a surface may be considered to be rough when it has a texture that is larger in size than the wavelength of the light.

As shown in the left side portion of FIG. 2, when an incoherent source 106i emits incoherent light 222 toward a rough surface 210, the reflected light 224 has a relatively uniform intensity. In particular, the intensity of light varies smoothly with viewing angle, as shown by the regularly decreasing the lengths of the arrows across different angles.

However, as shown in the right side portion of FIG. 2, when a coherent source 106c emits coherent light 232 toward the same rough surface 210, strong constructive and destructive interference causes the reflected light 234 to have a highly irregular intensity distribution profile, where the same point on the surface may appear significantly different when observed through different angles, giving rise to the aforementioned speckle noise and its dependence on viewing angle. Although constructive and destructive interference may also take place in the case of the incoherent light source, there is sufficient diversity in the phase and/or wavelength of the emitted light that the effects of interference are substantially averaged and thus become negligible.

The degree to which this form of speckling is observed depends on the aperture of the detector, the sampling rate of the detector, and the degree of coherence of the light source. The degree of coherence statistically quantifies how correlated the ensemble of photons behave. A fully coherent ensemble would have a degree of coherence of 1 and a fully incoherent ensemble would have a degree of correlation of 0. Practical laser diodes generally have a significantly higher degree of coherence than many other types of light sources, such as light emitting diodes, fluorescent lights, incandescent lights, and sunlight.

In the case of stereo depth camera systems or 3D reconstruction systems, the coherence length of the light source can be significant compared with the useful operational range of the device. Coherence length refers to the distance along the propagation axis along which the projection beam retains the property of being primarily coherent, where primarily coherent refers to the photons in the beam remaining in phase (having the same frequency and phase offset) as they propagate through space. In other words, the typical useful operation range of the device is typically shorter than the coherence length of the light emitted by a laser diode projection source, and therefore the beam is primarily coherent within that operation range.

However, speckle noise can severely limit the capabilities of stereo and structured light depth sensors. First, as shown in FIG. 2, the speckling causes the appearance of the projection pattern to drastically change when viewed from different viewpoints or viewing angles. In stereo depth camera systems, this results in the same portion of the projection pattern to appear differently in the master and slave cameras, thereby resulting in poor correspondence matching (or feature matching).

Second, the speckle noise significantly increases the intensity non-uniformity (or intensity deviation from intended pattern) among the different features in the projection pattern. For example, for a pattern intended to be made up of dots of uniform intensity, the speckle noise leads to a high level of non-uniformity in the intensity of the dots. Furthermore, the non-uniformity is highly variable depending on the point of view and cannot be parameterized in general (e.g., different dots will be brighter, based on the viewing angle). This phenomenon complicates the design and limits the efficacy of processing algorithms that are intended to increase the signal-to-noise ratio of the raw input for the subsequent stages of processing and depth extraction.

Figure 3:
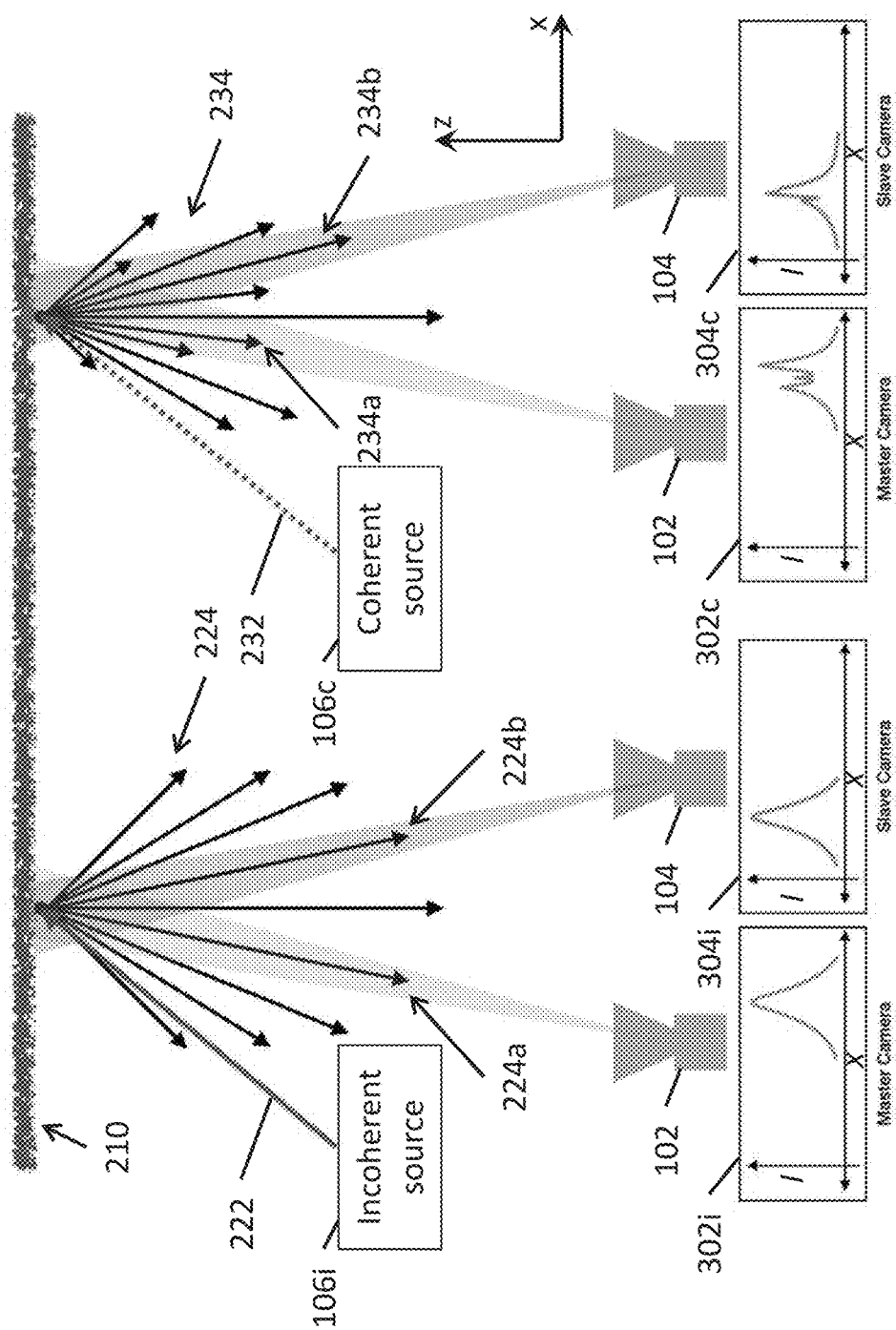
FIG. 3 is a schematic illustration of the effect of speckle noise on a stereo camera system.

FIG. 3 is a schematic illustration of the effect of speckle noise on a stereo camera system. Various portions of FIG. 3 are labeled with the same reference numerals as those of FIG. 2, and therefore descriptions thereof will not be repeated herein. The left portion of FIG. 3 shows a master camera 102 and a slave camera 104 capturing of light 224 reflecting off a rough surface 210 that is illuminated with incoherent light 222 from an incoherent source 106i. The master camera 102 and the slave camera 104 capture substantially similar images of the pattern because the reflected light 224 is relatively uniform, as depicted by the equal lengths of the arrows 224a and 224b directed toward the master 102 and slave 104 cameras, respectively, and as depicted in the substantially similar shapes of graphs 302i and 304i of measured intensity I with respect to position x (e.g., the graphs 302 and 304 may be thought of as portions of one row of the images captured by the cameras 102 and 104, respectively, where the portions correspond to images of the same part of the rough surface 210).

On the other hand, the right portion of FIG. 3 shows a master camera 102 and a slave camera 104 capturing light 234 reflecting off a rough surface 210 that is illuminated with coherent light 232 from a coherent source 106c, such as a projection source 106 that includes a laser diode. Due to the constructive and destructive interference of the reflected light, a speckle effect arises in the reflected light 234 and causes the master camera 102 and the slave camera 104 to capture significantly different images of the projected pattern, as depicted by the different lengths of the arrows 234a and 234b directed toward the master 102 and slave 104 cameras, respectively, and as depicted in the as depicted in the different shapes of graphs 302c and 304c of measured intensity I with respect to position x.

Therefore, mitigating the speckle noise in a laser projection system used for three-dimensional reconstruction through an active stereo depth camera system can yield significant improvements by improving the reliability of matching features between the master and slave cameras.

In the following discussion, speckle contrast, or speckle noise, is defined as the ratio of the standard deviation of the intensity fluctuation to the mean intensity. For example, assuming the noise has a uniform distribution, under this definition, the magnitude of speckle noise is between 0 and 1.

Diversity in laser wavelength leads to a drastic change in the appearance of speckle. In particular, projecting $N_\lambda$ beams (each of the $N_\lambda$ beams having a different wavelength) and subsequently averaging or integrating the measurements can provide sufficient diversity to cause the beams to become uncorrelated and reduce the speckle noise by a factor $R_\lambda$, where:

$$R_\lambda = \sqrt{N_\lambda}$$

if the relative phase-shift created by a rough surface on $N_\lambda$ beams is more than $2\pi$, so long as the $N_\lambda$ different wavelengths are separated by at least $\delta\lambda = \lambda^2/2\delta y$ where $\delta y$ is the roughness in nanometers, of the surface illuminated by the projection pattern.

Alternatively, for a broadband laser with a spectral width $\Lambda$, the reduction in the speckle noise is given by:

$$R_\lambda = \left(\frac{\Lambda}{\lambda}\right)^2$$

where, in the above equation, $\lambda$ is the central frequency of the broadband laser. This spectral width $\Lambda$ is typically full width at half maximum of the power spectral distribution of laser frequency profile.

The above-mentioned methods, however, are not directly applicable to optimal methods of laser projection typically used in systems for performing three dimensional reconstruction of scenes, such as time of flight camera systems and active stereo depth camera systems. In particular, according to conventional wisdom, the use of lasers with $N_\lambda$ different wavelengths requires several ($N_\lambda$) discrete laser components because lasers are generally considered to be fundamentally monochromatic (e.g., narrowband). Furthermore, in order to ensure the effectiveness of the system, the several discrete lasers are temperature stabilized to ensure that the various lasers maintain an adequate separation of $\delta\lambda$ in the wavelengths of the lasers. In addition, broadband lasers are not suitable for use in conjunction with diffractive optics to produce suitable projection patterns because the broad bandwidth results in the various wavelengths being affected differently by the diffractive optics, thereby resulting in fuzzy or blurry patterns.

Embodiments of the present invention may also be used to reduce speckle noise in laser projectors in other contexts, such as laser-based display systems. Related work in the area of reducing speckle noise generally involves: moving parts (such as a moving aperture or diffuser); screen vibration (or motion); multiple wavelengths using multiple lasers or a broadband laser; optical feedback in conjunction with a modulator; or liquid crystals. As another example, see U.S. patent application Ser. No. 15/274,994 "Systems and Methods for Compact Space-Time Stereo Three-Dimensional Depth Sensing," filed in the United States Patent and Trademark Office on Sep. 23, 2016, the entire disclosure of which is incorporated by reference. These various methods may have tradeoffs when applied to compact, low-power, low-cost systems where mechanically moving parts, multiple light sources, or liquid crystals may significantly increase the power requirements of a system and/or the expense of assembly, manufacture, or materials for such a system.

As such, embodiments of the present invention are directed to low-cost, power-efficient methods for reducing speckle noise using a single laser diode.

Temperature Dependence of Laser Light Emissions from a Laser Diode

Emission characteristics of semiconductor laser diodes are strongly temperature-dependent. While the exact physical mechanisms causing this dependence vary based on the type of the semiconductor laser diode (semiconductor materials and band-structure properties, optical resonant cavity properties, and coupling of the emission out of the laser diode) the temperature dependence is often present. For example, in the case of the common single mode NIR Fabry-Perot laser diodes which can support multimode operation just above the lasing threshold, temperature variation can lead to a change in the gain profile of the cavity through a refractive index change, and in turn result in mode-hopping between nearby longitudinal modes. For non-stabilized lasers, this mode hopping occurs stochastically and can be detected as a change in the laser wavelength by a several nanometers or the optical output power by a few percent. Within a limited range of interest for the temperature, the change in the laser wavelength can be approximated as:

$$\Delta\lambda = \theta_T \Delta T$$

where $\lambda$ is the laser wavelength, where $\Delta\lambda$ is the change in the laser wavelength from the nominal wavelength $\lambda_0$ (e.g. the emission wavelength of 845 nm for a typical Infrared laser may change from 835 nm to 855 nm) due to a temperature deviation of $\Delta T$ from the nominal operational temperature $T_0$, and $\theta_T$ is the wavelength thermal shift coefficient. For the example above, thermal coefficients on the order of $\theta_T \approx 0.3$ nm/° C. (where C is degrees Celsius) or less are common. Therefore, a 20° C. increase in temperature can result in as much as 6 nm increase in the wavelength ($\Delta\lambda$). The change in the laser diode optical power output is more specific to the particular diode, for example, this could be ~5% change in the optical output for a commercial TO-56 package laser diode SM830-200-TO56.

Figure 4:
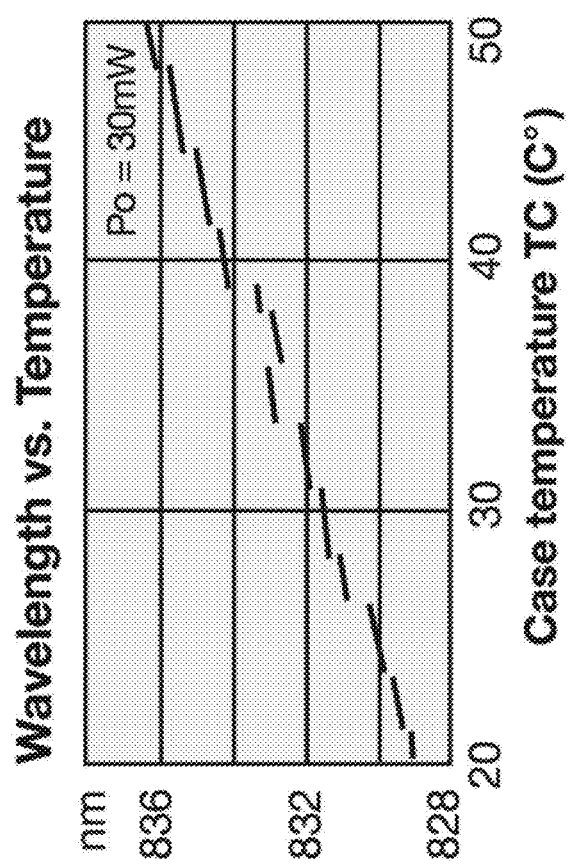
FIG. 4 is a graph illustrating an empirically measured relationship between the emission wavelength of a semiconductor laser and the temperature of the package surrounding the laser.

FIG. 4 is a graph illustrating an empirically measured relationship between the emission wavelength $\lambda$ of a semiconductor laser and the temperature T of the package surrounding the laser diode. Because it is difficult to measure the temperature of the laser diode itself, the case or package temperature is taken as an approximation of the diode temperature. As seen in FIG. 4, the measured wavelength of the emitted light varied approximately linearly with respect to the case temperature. In particular, over a range of temperatures from 20° C. to 50° C., the measured wavelength of the emitted light varied from about 829 nm to about 837 nm.

In standard industry practice, this change in emission wavelength due to changes in temperature is considered to be an undesirable property, especially in projection applications. As such, passive or active temperature regulation systems are generally used to stabilize the temperature of the semiconductor die of the diode laser. For example, in the case of active cooling, in order to achieve fully stable wavelength, thermoelectric cooling is typically used with a controller that is capable of stabilizing the die temperature to within a fraction of 1 degree Celsius (10's of milli-degrees Celsius). (Note that Vertical Cavity Surface Emitting Laser diodes (VCSEL) also exhibit temperature dependence in their emission characteristics.)

In contrast to standard industry practice (e.g., contrary to conventional wisdom), aspects of embodiments of the present invention use the temperature dependence of the emission wavelength to decrease the degree of coherence of the light emitted by the diode laser, thereby reducing the speckle effect and improving the performance of the projection system. In particular, such a projection system may be used in 3D sensing applications including structured light and active light stereo depth camera systems.

Figure 7:
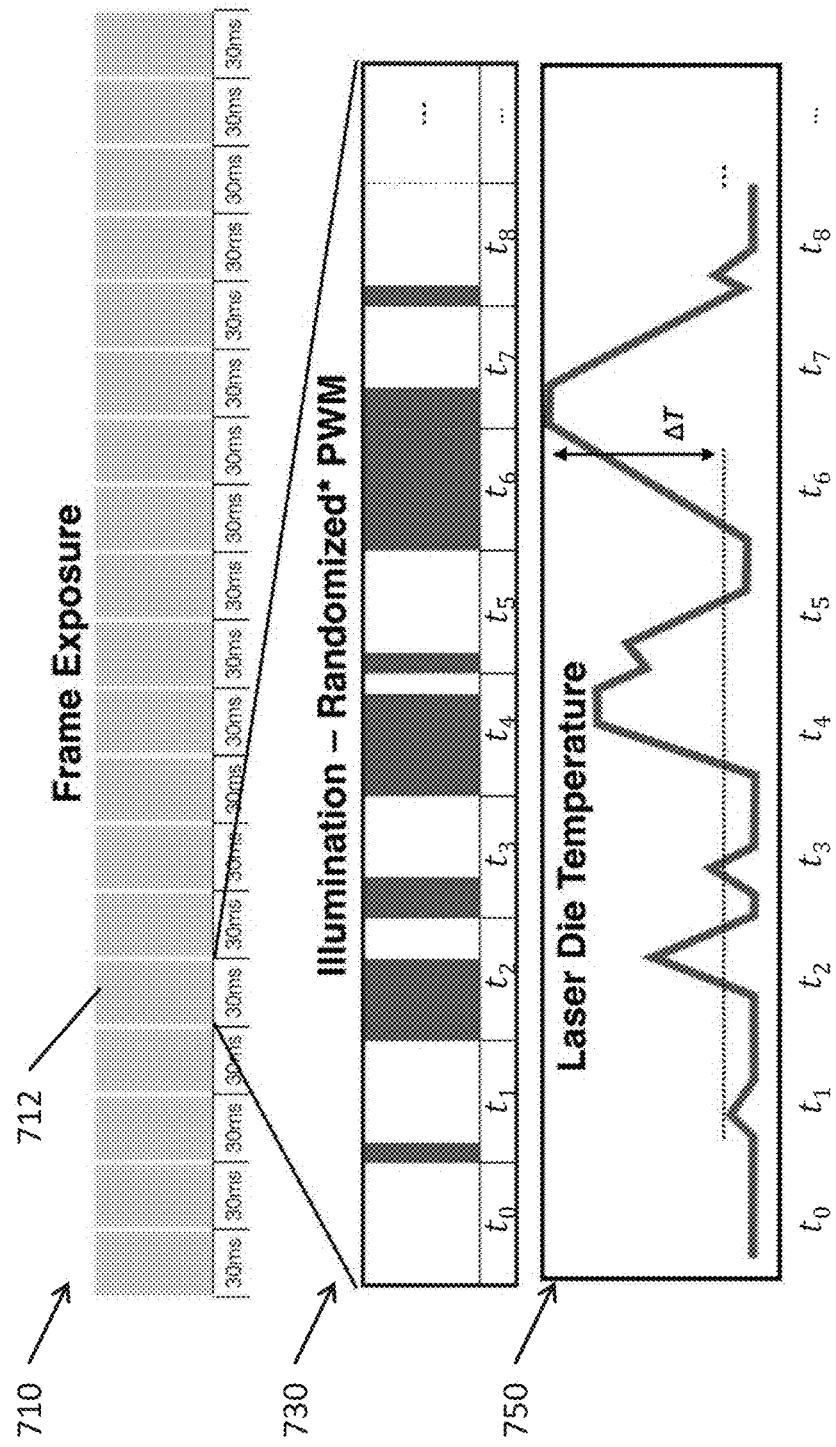
FIG. 7 is a schematic diagram illustrating modulation of the temperature of a laser die during the exposure interval of a single frame, thereby modulating the wavelength of the light emitted by the laser according to one embodiment of the present invention.

Note that in the above, the temperature T refers to the temperature of the semiconductor die. In practice, the die is typically mounted inside a package such as a transistor outline (TO) package or on a submount, which has a much larger thermal mass than the die itself. The large disparity in the thermal masses and the thermal resistance between the laser die and the package/submount lead to temperature transients which can be quite different from the steady state temperature of the laser die. In particular, comparatively rapid changes in the effective drive current can lead to rapid temperature modulation of the temperature T of the die, while the diode package may be remain at the nominal operation temperature, or otherwise be much slower to respond to changes in temperature due to its high thermal mass. Therefore, it is possible to induce a large change in the laser die temperature T, whereas the change in the package temperature is much smaller, or negligible in comparison, as shown in FIG. 7, discussed in more detail below.

Controlling Emission Wavelength Through Pulse Width Modulation

In embodiments of the present invention, the temperature dependence of the emission characteristics of a single mode laser diode, in particular its wavelength, is used to time-multiplex many projections with substantially different speckle patterns over a projection interval. (This can be contrasted to the above-described techniques, such as using multiple different lasers, each configured to emit light at a different wavelength, and broadband lasers.) The various projections emitted during the projection interval are integrated in the camera or any exposure-based sensing system during an exposure interval that coincides with or overlaps with the projection interval.

Figure 5:
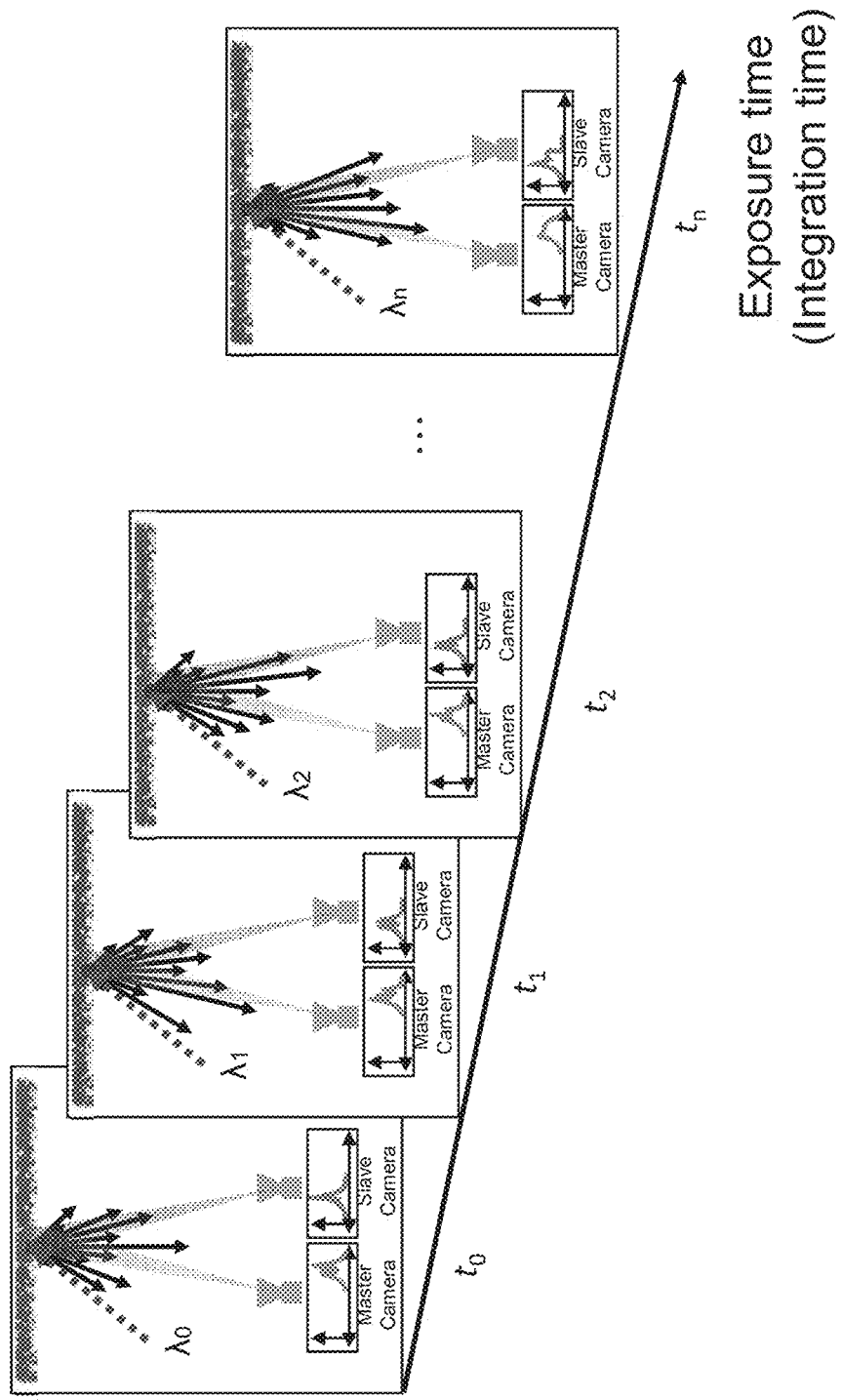
FIG. 5 is a schematic diagram illustrating variation in speckle noise variation due to wavelength modulation within a single frame exposure time (integration time) or exposure interval according to one embodiment of the present invention.

FIG. 5 is a schematic diagram illustrating variation in speckle noise variation due to wavelength modulation within a single frame exposure time (integration time) or exposure interval according to one embodiment of the present invention. As shown in FIG. 5, during n different sub-intervals t of the exposure interval of a single frame, an incoherent light source emits light having different wavelengths $\lambda_i$. FIG. 5 illustrates sub-intervals $\{t_0, t_1, t_2, \ldots, t_n\}$ and corresponding wavelengths of emitted light $\{\lambda_0, \lambda_1, \lambda_2, \ldots, \lambda_n\}$ during those intervals. As discussed above, the appearance of the speckle noise varies with the wavelength $\lambda$ of the emitted light, and therefore, assuming that the wavelengths of light are different during the different intervals, the cameras 102 and 104 capture different speckle patterns 302 and 304 during the sub-intervals t. During an i-th sub-interval $t_i$, camera 102 captures pattern $302c_i$, and camera 104 captures pattern $304c_i$. For example, during sub-interval $t_0$, camera 102 captures pattern $302c_0$, and camera 104 captures pattern $304c_0$. As seen in FIG. 5, the received pattern is different during each of the depicted sub-intervals as illustrated by the different graphs $302c$ and $304c$ in each of the sub-intervals.

Figure 6:
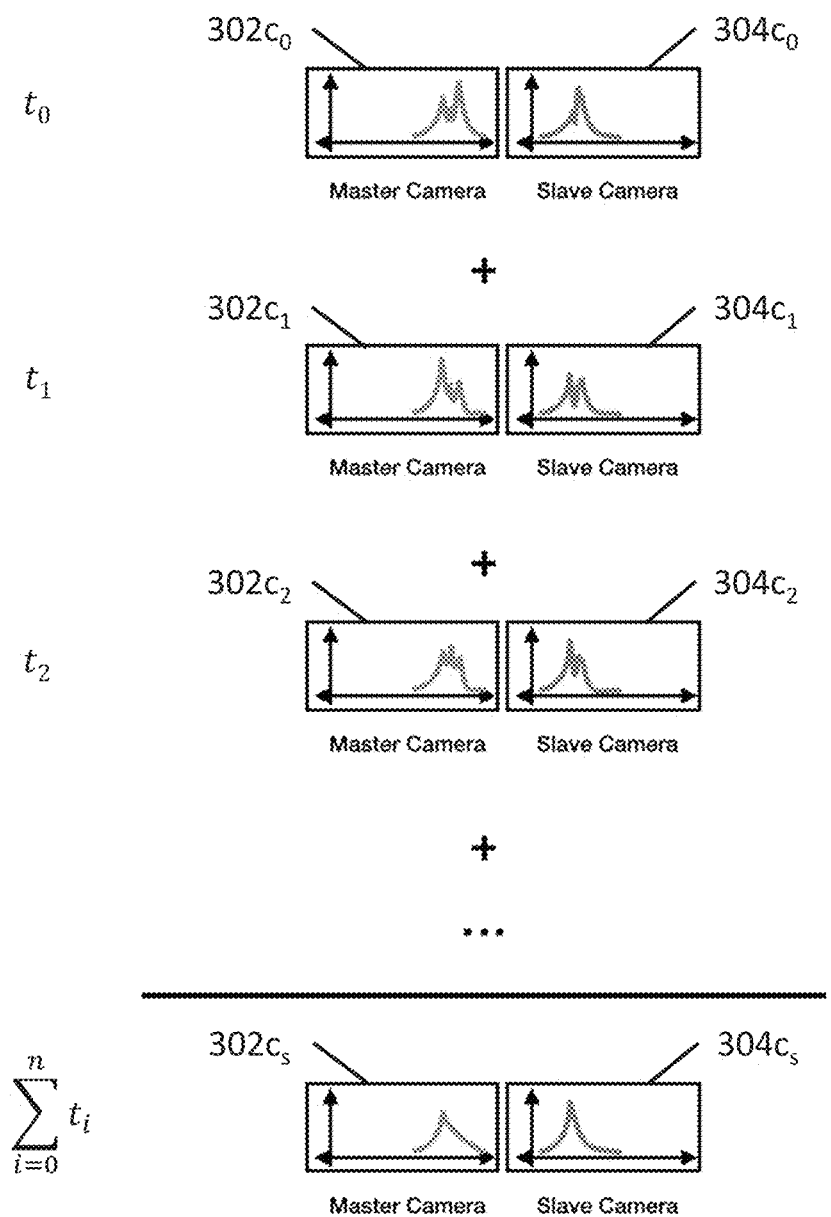
FIG. 6 is a schematic diagram illustrating spatial smoothing of the speckle noise through temporal integration according to one embodiment of the present invention.

FIG. 6 is a schematic diagram illustrating spatial smoothing of the speckle noise through temporal integration according to one embodiment of the present invention. The patterns $302c$ and $304c$ captured the cameras 102 and 104 during various sub-intervals t (e.g., $t_0, t_1, t_2, \ldots$) are shown. When the individual patterns received over the n sub-intervals are added together ($\Sigma_{i=0}^{n} t_i$), the overall effect of the speckle noise is smoothed out, and the pattern detected over the exposure intervals (made up of the n sub-intervals), as shown in the resulting graphs $302c_s$ and $304c_s$, is similar to that received when using an incoherent light source (compare with the graphs $302i$ and $304i$ for the incoherent light shown in the left side of FIG. 3).

As such, embodiments of the present invention can reduce the appearance of speckle noise when using a coherent light projection source and can therefore achieve performance similar to that of an incoherent light source, while retaining the benefits of a coherent light source (e.g., usability with diffractive optics), and without the added cost of using multiple lasers having different emission wavelengths.

In some embodiments of the present invention, the projection source 106 is a single mode laser diode that is controlled to emit light at different wavelengths during different sub-intervals by controlling the temperature of the die of the laser diode. In some embodiments, the single mode laser diode is the only light source in the projection source 106 (e.g., the projection source does not include multiple laser diodes, where each laser diode is configured to emit light at a different wavelength). In some embodiments, such as embodiments in which the light does not interact with a diffractive optical system, the projection source may be any type of laser diode (e.g., the laser diode may be a multi mode laser diode).

FIG. 7 is a schematic diagram illustrating modulation of the temperature of a laser die during the exposure interval of a single frame, thereby modulating the wavelength of the light emitted by the laser according to one embodiment of the present invention. The Frame Exposure portion 710 shows the capture of nineteen separate frames 712 or images over time. In the embodiment shown in FIG. 7, it is assumed that the cameras (e.g., cameras 102 and 104) are configured to capture images at a rate of 30 frames per second, and therefore the exposure interval of each frame 712 is approximately 30 ms.

In order to modulate the laser die temperature substantially, according to one embodiment of the present invention, a pseudo-random pulse-width-modulation (PWM) (or pulse width modulated) signal is used as the driving signal for the laser diode, as shown in FIG. 7. The Illumination–Randomized*PWM portion 730 shows the control of application of power to a laser diode using a pulse-width-modulation (PWM) technique over a plurality of sub-intervals t 732 during a single frame 712, where the shaded portions indicate the application of power to the projection source 106. As shown in FIG. 7, each pulse begins at the start of a sub-interval t and the width of the pulse is pseudo-randomly determined. While FIG. 7 shows nine sub-intervals ($t_0, t_1, t_2, t_3, t_4, t_5, t_6, t_7, t_8$), embodiments of the present invention are not limited thereto and may be used with different numbers of sub-intervals. In various embodiments of the present invention, the number of sub-intervals (or epochs) is set such that the frequency of change in wavelengths (e.g., the inverse of the number of sub-intervals over time) is substantially higher than the sampling rate of the detector that the projection source is used with. In some embodiments, the cameras 102 and 104 are configured to capture images at a rate of 30 frames per second, with an integration time of 30 milliseconds. In one embodiment, the frequency of changes is at least ten times higher than the sampling rate of the detector, and therefore the frequency of changes is to the wavelength may be set to be at least 300 changes per second (e.g., at least ten (10) sub-intervals during an exposure interval, which corresponds to at least 300 sub-intervals per second, resulting in at least 300 pulses emitted per second, each sub-interval being less than 1/300th of a second long or less than about 3.333 milliseconds long). In another embodiment, the frequency of changes is approximately fifty times higher than the sampling rate of the detector, and therefore the frequency of the changes may be set to be at least 30×50=1500 changes per second (e.g., fifty (50) sub-intervals per exposure interval, which corresponds to 1500 sub-intervals per second, resulting in 1500 pulses per second, each sub-interval being 1/1500 of a second long or about 667 microseconds long). In experiments performed using a 30 ms exposure interval and a diode laser having a nominal emission wavelength of 850 nm, statistically significant reductions in speckle noise are detectable when there are ten wavelength changes in each exposure interval (e.g., when there are at least ten sub-intervals per exposure interval), and substantial improvements in uniformity of the projected pattern are observed when there are at least fifty wavelength changes in each exposure interval (when there are at least fifty sub-intervals per exposure interval). As another example, the detector may be a human eye. In addition, while FIG. 7 depicts the sub-intervals as all having the same length, embodiments of the present invention are not limited thereto and may be used with sub-intervals of different lengths. Furthermore, while FIG. 7 shows that power is applied beginning at the start of the sub-interval, embodiments of the present invention are not limited thereto. For example, in some embodiments, the start time of the pulse may also be varied from one sub-interval to another.

As shown in the Laser Die Temperature portion 750 of FIG. 7, the pseudo-random PWM signal causes the temperature of the laser diode die to vary over time (e.g., over the various sub-intervals). The temperature of the laser diode die depends on the total or net amount of heating and cooling applied to the laser diode die over time, and as such, may depend on both the length and amplitude of the pulse applied during the current sub-interval as well as the pulses applied during previous sub-intervals. For example, in the embodiment shown in FIG. 7, the laser diode die begins at the same temperature in sub-intervals $t_1$ and $t_2$, but because the pulse applied during sub-interval $t_2$ is longer (or has more energy) than the pulse applied during sub-interval $t_1$, the laser diode die reaches a higher temperature during sub-interval $t_2$ than it does during sub-interval $t_1$, and therefore the laser diode emits different wavelengths of light in sub-intervals $t_1$ and $t_2$. In addition, in the embodiment shown in FIG. 7, the pulse applied during sub-interval $t_3$ is the same length as the pulse applied during sub-interval $t_7$. However, due, in part, to the long pulse applied during sub-interval $t_6$ (or due to a lack of time to cool the laser diode die after the pulse of sub-interval $t_6$), the temperature of the laser diode die during sub-interval $t_7$ is higher than its temperature during sub-interval $t_3$, and therefore the laser diode emits light having different wavelengths in sub-intervals $t_3$ and $t_7$. The dotted line indicates the average temperature of the laser die, and the value $\Delta T$ indicates the maximum temperature difference reached by the laser die over the course of the frame. As discussed above, this change in temperature also causes the wavelength of the emitted light to change, thereby resulting in a diversity of wavelengths of light to be emitted during the course of an exposure interval, and therefore the temperature range $\Delta T$ corresponds to the change in wavelength (or the range of wavelengths) emitted over the course of the exposure interval. This change in temperature and change in wavelength is significantly greater than the magnitude of change in temperature and wavelength observed in conventional laser projection systems that are actively and/or passively cooled to maintain a stable temperature and stable output wavelength.

Due to the small thermal mass of the die, and the large thermal mass of the package, the laser diode temperature varies significantly, and on a time scale comparable to that of the excitation pulse, based on the duty cycle of the PWM. In other words, the temperature of the die depends primarily on the power applied to the laser die through the PWM signal. For example, the temperature generally rises after the application of power to the laser diode, and the temperature begins to decrease once power is no longer applied. As a more specific example, during sub-interval $t_2$, the temperature of the laser die increases at some time after the application of power, and the temperature reaches a peak and begins to decrease at a time coinciding with the end of the pulse.

Some embodiments of the present invention are directed to driving a near-infrared (NIR) single-mode laser diodes of the type typically used in 3D sensing applications. These NIR single-mode laser diodes commonly have an optical output rating of a few 10's to several 100's of milliwatts (mW), and power conversion efficiencies of 40%-60%. Therefore, about an equal amount of power (on the order of 10's to 100's of milliwatts) is dissipated within the die as heat. For sufficiently short pulses, the laser die temperature can rapidly respond to this excitation whereas the total amount of heat transferred to the package is small enough that the change in the package temperature is relatively small or negligible. Therefore, by using pulses of different duty cycles, embodiments of the present invention achieve temperature modulation of the laser die without interfering with the thermal management capabilities of the package (e.g., without interfering with the ability of the package to cool the laser die). For example, the temperature of the laser die increases when the amount of power dissipated as heat (the thermal load of the laser) exceeds the rate at which the heat is removed by the package (the thermal capacity of the package and any associated thermal management components, such as heatsinks).

Embodiments of the present invention using such a driving method (e.g., using pseudo-random pulse-width-modulation with duty cycles uniformly distributed over 0%-100%) would result in an average of 50% duty cycle (e.g., about 150 mW average optical output for a laser die with 300 mW peak optical output). This pseudo-random pulse-width-modulation driving signal would heat the laser die to random temperatures within the operating range, as shown in part 750 of FIG. 7, and therefore the laser will emit coherent light at different wavelengths over time, depending on the temperature of the laser die at the time of emission. As described above, however, the pulses, once aggregated over the course of the exposure interval of a frame, produce a substantially different speckle pattern when compared with a continuous-wave (CW) laser die with similar average optical output. In particular, the speckle noise is significantly reduced. In cases where the average optical output of the system is to be modified, a different statistical distribution for the pulse-duty cycle (i.e. other than uniform distribution) may be used, which may have an average duty cycle greater than or less than 50%, as desired.

Embodiments of the present invention may be applied with the techniques described in U.S. patent application Ser. No. 15/341,954 "SYSTEM AND METHOD FOR HIGH DYNAMIC RANGE DEPTH CAPTURE USING MULTIPLE CAMERAS," filed in the United States Patent and Trademark Office on Nov. 2, 2016, the entire disclosure of which is incorporated by reference, in which the projection power of the projection source is varied from frame-to-frame in order to achieve high depth dynamic range imaging (e.g., proper exposure of both dark and bright portions of the scene). As such, the average duty cycle over the course of a frame can be set based on the desired projection power for a given frame. The projection power may have an upper limit in this case because, as the duty cycle approaches 100%, the laser die may not have sufficient time to cool in order to achieve sufficient diversity in the wavelength of the emitted light over time (e.g., above some threshold duty cycle, the temperature of the die may remain stable over the course of the frame).

While a psuedo-random pulse-width-modulation signal is used in this case, embodiments of the present invention are not limited thereto. For example, in some embodiments of the present invention, the PWM signal follows a particular pattern during each frame (e.g., controlled such that the temperature of the laser die varies in a way to achieve sufficient diversity in the wavelengths of the emitted light during a frame). For example, the duty cycle of the successive pulses can be varied (e.g., the pulses may be longer for each successive sub-interval of an exposure interval, resetting to a short pulse during the first sub-interval of a following exposure interval) such that successive pulses differ by more than a particular percentage in order to provide a sufficient change in the wavelength of the emitted light, as described in more detail below. In some embodiments, the duty cycle of the PWM may be the same in successive pulses, so long as the heat applied to the laser die during the pulse exceeds the heat dissipated between pulses is sufficient to increase the temperature of the laser die to cause a change in emission wavelength (e.g., a change exceeding $\delta\lambda$).

As discussed above, in the case of multiple beams, the beams become uncorrelated and reduce the speckle noise by a factor of $R_\lambda$, where:

$$R_\lambda = \sqrt{N_\lambda}$$

when the $N_\lambda$ different wavelengths need to be separated by at least:

$$\delta\lambda = \lambda^2/2\delta y$$

where $\delta y$ is the roughness of the surface illuminated by the projection pattern. The number of different wavelengths of light to be emitted during an exposure interval may range from $N_{min}$ to $N_{max}$, where $N_{min}$ is constrained based on the minimum reduction factor $R_{min}$ demanded by the operating conditions (where $N_{min}$ is $R_{min}^2$ in accordance with the above equation), and where $N_{max}$ is constrained based on the capability of the laser driver circuitry and the electrical parasitic impedances that determine the shortest possible pulse that can be applied to the laser diode. The maximum roughness $\delta y$ of surfaces for which speckle noise would affect the matching process can be estimated to the maximum theoretical precision of the depth sensing system, e.g., based on camera field of view, camera sensor resolution, and stereo matching algorithm noise, which in practice comes down to several hundred microns to a few millimeters. Therefore, the minimum wavelength separation $\delta\lambda$ can be set based on the maximum depth precision of the depth sensing system. For example, given surface roughness $\delta y$ of 500 μm and a laser center (or nominal) wavelength of 850 nm, a $\delta\lambda$ of at least 1.445 nm would provide significantly improved speckle reduction when projecting the pattern onto surfaces with roughness less than $\delta y$. As such, driving the laser such that at least 9 different wavelengths of light are emitted during one exposure interval would reduce the speckle noise by a factor of 3. (Note that this does not necessarily require that the wavelengths be different by $9\times\delta\lambda$, but that the wavelengths be different by at least $\delta\lambda$).

Alternatively, in case the roughness of a surface is not known a-priori, the speckle reduction factor may be approximated by considering in the limit a broadband laser. As noted above in the case of a broadband laser with a spectral width Λ, the reduction in the speckle noise is given by:

$$R_\lambda = \left(\frac{\Lambda}{\lambda}\right)^2$$

This spectral width Λ is typically full width at half maximum of the power spectral distribution of laser frequency profile. As noted above, the change in laser wavelength can be approximated as:

$$\Delta\lambda = \theta_T \Delta T$$

However, a broadband laser, unlike a single mode laser, will not be suitable for use with pattern-generating diffractive optical elements, such as the types that may be used in an active depth camera system. On the other hand, a single mode laser diode that is compatible with such diffractive optical elements emitting a plurality of different wavelengths at different times over the course of an exposure interval can achieve a similar reduction in speckle noise $R_\lambda$ of:

$$R_\lambda = \left(\frac{\theta_T \Delta T}{\lambda}\right)^2$$

by controlling the temperature of the laser die to vary over a range of temperatures ΔT.

Figure 8A:
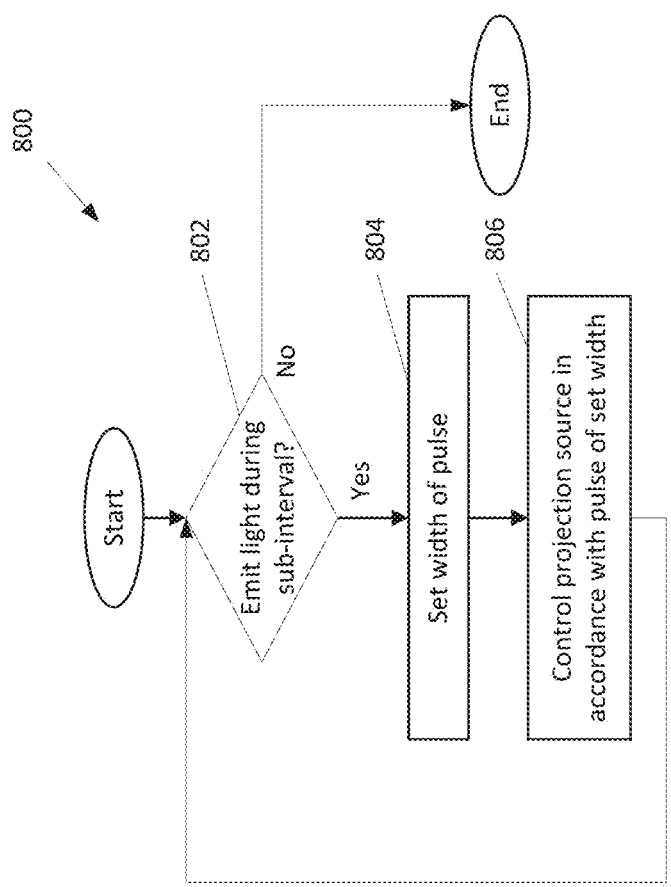
FIG. 8A is a flowchart illustrating a method for controlling a diode laser over a period of time according to one embodiment of the present invention.

FIG. 8A is a flowchart illustrating a method 800 for controlling a diode laser over a period of time according to one embodiment of the present invention. In operation 802, the host processor 108 determines whether light should be emitted during a following sub-interval $t_k$. For example, this may relate to whether or not the projection source 106 should emit light, based on whether the cameras will be capturing images or based on whether or not active projection is to be provided during an exposure interval. In operation 804, assuming a pulse-width-modulation control, the host processor 108 sets the width of the next pulse that will be used to control the projection source 106, and in operation 806, the host processor controls the projection source 106 in accordance with a pulse of the width set in operation 804.

As discussed above, the processor may set the width of the pulse in a pseudo-random manner, such as by using a random number generator, or by using another source of randomness. In other embodiments, the width of the pulses may follow a particular pattern.

After controlling the projection source 106 in operation 806, the host processor 108 returns to operation 802 to determine if light should be emitted during the next sub-interval $t_{k+1}$. If so, then the host processor 108 continues with setting the width of the pulse in operation 804, and controlling the projection source 106 to emit light in operation 806, as described above. If light is not to be emitted during the next sub-interval, then the process may be completed.

As discussed above, the wavelength $\lambda_k$ of the coherent light emitted during the sub-interval $t_k$ depends on the temperature $T_k$ of the laser die during the sub-interval. A portion of the power applied to the projection source 106 in accordance with the pulse supplied in operation 806 is dissipated as heat in the projection source 106, thereby heating the projection source (e.g., the laser die) and raising its temperature.

As a result, the temperature $T_{k+1}$ of the projection source 106 during the following sub-interval $t_{k+1}$ may be different from its temperature $T_k$ during the previous-sub-interval $t_k$. As a result, when the projection source 106 emits light in response to operation 806, the emitted coherent light is at a second wavelength $\lambda_{k+1}$ in accordance with the temperature of the laser die $T_{k+1}$. Temperature $T_{k+1}$ may be greater than temperature $T_k$ because the laser die was heated in operation 802. Assuming that $T_{k+1} \neq T_k$ (e.g., $T_{k+1} > T_{k+1}$):

$$\lambda_{k+1} \approx \lambda_k + \Delta\lambda$$
$$\approx \lambda_k + \theta_T \Delta T$$
$$\approx \lambda_k + \theta_T (T_{k+1} - T_k)$$

As discussed above, when $|\lambda_{k+1} - \lambda_k| > \delta\lambda$, the speckle noise is reduced for surfaces with roughness less than or equal to $\delta y$, where $\delta\lambda = \lambda^2/2\delta y$ and $\lambda$ is approximately equal to $\lambda_k$ and $\lambda_{k+1}$.

While FIG. 8A is described above with respect to emitting light during two sub-intervals $t_k$ and $t_{k+1}$ during which the projection source 106 is at two different temperatures $T_k$ and $T_{k+1}$ to emit light at two different wavelengths $\lambda_k$ and $\lambda_{k+1}$, embodiments of the present invention are not limited thereto and can be used to emit light at a plurality of different wavelengths at a plurality of different temperatures during a plurality of different sub-intervals, as shown, for example, in FIG. 7. The particular number of different wavelengths and the range of wavelengths emitted can be determined based on the usage conditions (e.g., the roughness $\delta y$ of the surfaces reflecting the coherent light and the nominal wavelength $\lambda$ of the coherent light), and based on the operating temperature limits of the projection source 106. For example, as discussed above, assuming a surface roughness $\delta y$ of 500 μm and a nominal wavelength $\lambda$ of 850 nm, the difference in wavelength between the light emitted in different sub-intervals $|\lambda_{k+1} - \lambda_k| = \delta\lambda$ is at least 1.445 nm.

Figure 8B:
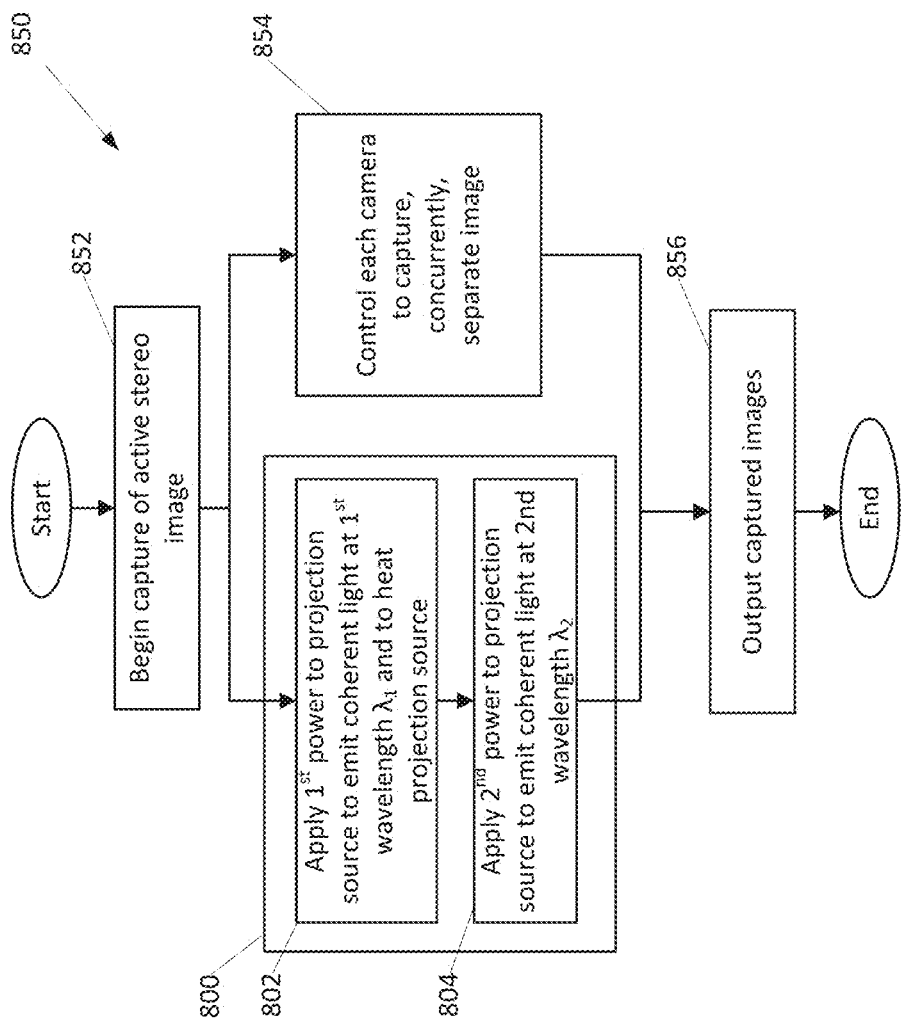
FIG. 8B is a flowchart illustrating a method for controlling an active stereo depth camera system according to one embodiment of the present invention.

FIG. 8B is a flowchart illustrating a method 850 for controlling an active stereo depth camera system according to one embodiment of the present invention. The method of FIG. 8B may be performed by the host processor 108 controlling the projection source 106 and the cameras 102 and 104. In operation 852, the host processor 108 begins the capture process (e.g., a trigger to capture a frame of video). In operation 854, the host processor 108 controls each camera (e.g., the cameras 102 and 104) to capture an image. In other words, the master camera 102 captures an image and the slave camera 104 concurrently captures an image. The interval of time during which the master camera 102 and the slave camera 104 capture their corresponding single images may be referred to as the exposure interval.

During the exposure interval, the host processor 108 also controls the projection source 106 to emit light in accordance with method 800. In particular in operation 802, the host processor 108, applies a first power to the projection source 106 during a first sub-interval of the exposure interval, and in operation 804 the host processor 108 applies a second power to the projection source 106 during a second sub-interval of the exposure interval. Due to the heating of the laser die during the first sub-interval, the temperature $T_2$ of the laser die during the second sub-interval is different from its temperature $T_1$ during the first sub-interval. As a result, the projection source emits light in a first wavelength $\lambda_1$ during the first sub-interval and in a second wavelength $\lambda_2$ during the second sub-interval. The light emitted at the first wavelength $\lambda_1$ during the first sub-interval and at the second wavelength $\lambda_2$ during the second sub-interval is detected by the image sensors of the cameras 102 and 104 during the exposure interval. As such, the cameras detect light emitted at a plurality of different wavelengths during an exposure interval, even though the light was emitted by a coherent projection source 106.

In operation 856, the captured images are output, for example, to a process for image processing such as an algorithm for computing a disparity map. The image processing may be performed by the host processor 108 or may be performed by another processor coupled to the system 100 via the bus, the network adapter, or other connection.

The bounds on the minimum and maximum temperature of the laser, which in turn impact the effectiveness of this method in reducing the speckle noise, depend upon the output power and conversion efficiency of the laser diode, the thermal mass of the laser diode and thermal resistance to the package, and the minimum and maximum excitation pulse duration. For a well-tuned system, it is possible to achieve speckle reduction on the order of 10%-30% or more.

Figure 9A:
FIG. 9A is a depiction of a disparity map generated by an active stereo depth camera system using a laser diode driven in a continuous wave (CW) manner.
Figure 9B:
FIG. 9B is a depiction of a disparity map generated by an active stereo depth camera system using a laser diode driven in a pulse-width-modulation (PWM) manner according to embodiments of the present invention.

FIG. 9A is a depiction of a disparity map generated by an active stereo depth camera system using a laser diode driven in a continuous wave (CW) manner. FIG. 9B is a depiction of a disparity map generated by an active stereo depth camera system using a laser diode driven in a pulse-width-modulation (PWM) manner according to embodiments of the present invention. The disparity maps shown in FIGS. 9A and 9B were generated using the same processing algorithm for establishing correspondence between the master and slave cameras (e.g., cameras 102 and 104). A high disparity indicates that the matching features are found in locations that are far apart in the images captured by the master and slave cameras 102 and 104, and low disparity indicates that the features are close. As such, a disparity map provides information about the distance to various features (e.g., regions of high disparity are relatively close to the depth camera system and regions of low disparity are farther away).

In FIGS. 9A and 9B, the regions in dark blue indicate regions where the algorithm could not establish correspondence between the master and slave images (e.g., matched features or portions of the pattern), and the regions colored in the range from light blue to red indicate that algorithm established correspondence and calculated a disparity for that portion. The light blue end of the range indicates lower disparity, and the red end of the range indicates high disparity).

In FIG. 9A, the brightly colored surface is interrupted with numerous dark blue gaps or holes, indicating that the algorithm failed to find correspondences in those regions. On the other hand, in FIG. 9B, there are significantly fewer and smaller gaps or holes of dark blue. This improvement in the robustness of establishing correspondence between regions of the master and slave images is attributed to the driving method of embodiments of the present invention, because the only change to the system between FIG. 9A and FIG. 9B was the change from CW driving to PWM driving of the laser diode to increase the wavelength diversity of the projected light, and thereby reduce speckle.

Given that methods according to embodiments of the present invention generally require no additional hardware and do not involve the use of any moving parts (e.g., the projection system has no moving parts), it is highly attractive in significantly increasing the performance of the 3D reconstruction system by making correspondence establishment more robust.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

For example, embodiments of the present invention may also be used to reduce speckle noise when laser diodes are used in other applications. These other applications include display devices (e.g., televisions, video projectors, and computer monitors) that use a laser diode (e.g., configured to emit visible light) as a light source. In such an example, the laser diode may be controlled to emit light at a plurality of different wavelengths during each frame displayed by the display device, where the frequency of changes to the emission wavelength is significantly greater (e.g., at least ten times) the sampling rate of the detector. The frame rate of the display device may be set in accordance with the circumstance where the detector is a human eye. Accordingly, the frame rate of a display device may be, for example, 24 frames per second (e.g., in the case of a movie projector), 30 frames per second (e.g., in the case of standard television), 60 frames per second (e.g., in the case of a computer monitor or display), or more (e.g., 120 frames per second or more in the case of some televisions), thereby resulting in corresponding exposure intervals of the inverse of the frame rate (e.g., 60 frames per second corresponds to an exposure interval of about 16 ms). Other applications include increasing the stability of the appearance of other laser light projections, such as a projected keyboard using a laser light source (Tomasi, Carlo, Abbas Rafii, and Ilhami Torunoglu. "Full-size projection keyboard for handheld devices." Communications of the ACM 46.7 (2003): 70-75.), projected laser grids (e.g., laser levels), laser pointers, and laser light displays.

What is claimed is:

1. A stereo camera system comprising:
   a processor;
   a plurality of cameras coupled to the processor and configured to have overlapping fields of view, the cameras comprising a first camera and a second camera;
   a coherent light projection source coupled to the processor and configured to emit light toward the fields of view of the cameras; and
   memory coupled to the processor, the memory storing instructions that, when executed by the processor, cause the processor to:
   apply power in a plurality of pulses to the projection source to control the projection source to emit coherent light during an exposure interval comprising at least two sub-intervals, the applied power causing the projection source to have different temperatures during first and second sub-intervals of the at least two sub-intervals, wherein the projection source emits light having different wavelengths during the first and second sub-intervals in accordance with the different temperatures of the projection source; and
   control the first camera and the second camera to concurrently capture, respectively, a first image and a second image over the exposure interval.

2. The stereo camera system of claim 1, wherein the at least two sub-intervals comprise at least ten sub-intervals.

3. The stereo camera system of claim 2, wherein the at least two sub-intervals comprise at least fifty sub-intervals.

4. The stereo camera system of claim 1, wherein the coherent light projection source is a single mode laser diode.

5. The stereo camera system of claim 4, further comprising a diffractive optics system,
   wherein the coherent light projection source is configured to emit light through the diffractive optics system.

6. The stereo camera system of claim 1, wherein the memory further stores instructions that, when executed by the processor, cause the processor to control the projection source using a pulse width modulated signal,
   wherein the power applied during the first sub-interval corresponds to a first pulse of the pulse width modulated signal, and
   wherein the power applied during the second sub-interval corresponds to a second pulse of the pulse width modulated signal.

7. The stereo camera system of claim 6, wherein the different wavelengths comprise first and second wavelengths respectively controlled in accordance with the energy of the first and second pulses.

8. The stereo camera system of claim 6, wherein the pulse width modulated signal is generated pseudo-randomly.

9. The stereo camera system of claim 6, wherein the pulse width modulated signal has a pattern during the exposure interval.

10. The stereo camera system of claim 6, wherein a duty ratio of the pulse width modulated signal is controlled in accordance with a target projection power of the projection source.

11. The stereo camera system of claim 1, wherein the different wavelengths comprise first and second wavelengths and wherein the difference in wavelength between the first wavelength and the second wavelength is greater than 1.5 nm.

12. The stereo camera system of claim 1, wherein the projection source contains no moving parts.

13. The stereo camera system of claim 1, wherein the images captured by the cameras are provided to a depth sensing application.

14. A method for capturing images, comprising:
    applying power in a plurality of pulses to a projection source to control the projection source to emit coherent light during an exposure interval comprising at least two sub-intervals, the applied power causing the projection source to have different temperatures during first and second sub-intervals of the at least two sub-intervals, wherein the projection source emits light having different wavelengths during the first and second sub-intervals in accordance with the different temperatures of the projection source; and
    controlling a first camera and a second camera to concurrently capture, respectively, a first image and a second image over the exposure interval, the first camera and second camera having overlapping fields of view, the projection source being configured to emit light toward the fields of view of the cameras.

15. The method of claim 14, wherein the at least two sub-intervals comprise at least ten sub-intervals.

16. The method of claim 15, wherein the at least two sub-intervals comprise at least fifty sub-intervals.

17. The method of claim 14, wherein the power applied during the first sub-interval corresponds to a first pulse of a pulse width modulated signal, and wherein the power applied during the second sub-interval corresponds to a second pulse of the pulse width modulated signal.

18. The method of claim 17, wherein the different wavelengths comprise first and second wavelengths respectively controlled in accordance with the energy of the first and second pulses.

19. The method of claim 17, wherein the pulse width modulated signal is generated pseudo-randomly.

20. The method of claim 14, wherein the different wavelengths comprise first and second wavelengths and wherein the difference in wavelength between the first wavelength and the second wavelength is greater than 1.5 nm.

21. A method for operating a coherent light projection source, comprising:

applying power in a plurality of pulses to the projection source to control the projection source to emit coherent light during an exposure interval comprising at least two sub-intervals, the applied power causing the projection source to have different temperatures during first and second sub-intervals of the at least two sub-intervals; and emitting light from the projection source, wherein the projection source emits light having different wavelengths during the first and second sub-intervals in accordance with the different temperatures of the projection source, wherein the first sub-interval is less than 1/10th the length of the exposure interval.

22. The method of claim 21, wherein the at least two sub-intervals comprise at least ten sub-intervals.

23. The method of claim 22, wherein the at least two sub-intervals comprise at least fifty sub-intervals.

24. The method of claim 21, wherein the power applied during the first sub-interval corresponds to a first pulse of a pulse width modulated signal, and wherein the power applied during the second sub-interval corresponds to a second pulse of the pulse width modulated signal.

25. The method of claim 24, wherein the different wavelengths comprise first and second wavelengths respectively controlled in accordance with the energy of the first and second pulses.

26. The method of claim 24, wherein the pulse width modulated signal is generated pseudo-randomly.

27. The method of claim 21, wherein the exposure interval is 30 milliseconds, wherein the first sub-interval is less than 7 microseconds, and wherein the second sub-interval is less than 7 microseconds.

* * * * *